United States Patent
Jenwatanavet

(10) Patent No.: US 8,692,728 B2
(45) Date of Patent: Apr. 8, 2014

(54) METHOD FOR AN ANTENNA GROUND PLANE EXTENSION

(75) Inventor: Jatupum Jenwatanavet, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 217 days.

(21) Appl. No.: 13/342,095

(22) Filed: Jan. 1, 2012

(65) Prior Publication Data

US 2013/0169504 A1    Jul. 4, 2013

(51) Int. Cl.
*H01Q 1/12* (2006.01)
(52) U.S. Cl.
USPC ............................ 343/718; 343/702; 343/848
(58) Field of Classification Search
USPC .............. 343/702, 718, 846, 848, 849
See application file for complete search history.

(56) References Cited

U.S. PATENT DOCUMENTS

| | | | |
|---|---|---|---|
| 4,070,676 A * | 1/1978 | Sanford | 343/700 MS |
| 4,329,689 A | 5/1982 | Yee | |
| 4,401,988 A | 8/1983 | Kaloi | |
| 6,879,288 B2 * | 4/2005 | Byrne et al. | 343/700 MS |
| 7,081,854 B2 | 7/2006 | Ying et al. | |
| 7,319,433 B2 | 1/2008 | Rosenberg et al. | |
| 7,456,792 B2 * | 11/2008 | Baliarda et al. | 343/702 |
| 7,528,781 B2 * | 5/2009 | Lin et al. | 343/700 MS |
| 7,535,431 B2 * | 5/2009 | Rowell | 343/846 |
| 7,903,034 B2 | 3/2011 | Anguera et al. | |
| 2011/0068985 A1 | 3/2011 | Hillersborg | |
| 2012/0299793 A1 * | 11/2012 | McLaughlin et al. | 343/848 |

FOREIGN PATENT DOCUMENTS

| | | |
|---|---|---|
| DE | 10348058 A1 | 6/2004 |
| EP | 1231825 A1 | 8/2002 |
| EP | 1670093 A1 | 6/2006 |

OTHER PUBLICATIONS

International Search Report and Written Opinion—PCT/US2012/072340—ISA/EPO—Mar. 13, 2013.

\* cited by examiner

*Primary Examiner* — Tho G Phan
(74) *Attorney, Agent, or Firm* — James T. Hagler

(57) ABSTRACT

The various embodiments include methods and apparatus relating to manufacturing a PCB assembly. The layers in a stacked arrangement forming the PCB assembly include at least one RF ground layer that extends in a unitary manner beyond the plurality of stacked layers to form an antenna ground plane that spans the portion of the layer within the PCB assembly and the portion of the layer extending beyond the PCB assembly. The extended conductive layer forms a continuous ground plane element along a width of the PCB assembly. The antenna ground plane extension extending beyond the PCB assembly may be flexible, enabling it to be fit within or extend beyond the casing of a small device, such as a watch telephone.

19 Claims, 10 Drawing Sheets

Top view

METHOD FOR AN ANTENNA GROUND PLANE EXTENSION

FIELD

The embodiments of the present disclosure relate to an antenna ground plane extension, and more particularly to an antenna ground plane extension for a small footprint wireless device.

BACKGROUND

Mobile computing devices have seen explosive growth over the past few years. With growing computational power and memory capacity, personal computing devices, have become essential tools of modern life, providing telephone and text communications, navigation, photo and video functionality in a package that fits in one's pocket. As a result of providing so many different types of radio frequency communications services and displaying high-quality video, many smart phones and similar mobile computing devices are now configured with a large number of programmable processors in a small footprint.

Currently, processors have become very smaller but more powerful. Many have attempted to create a smaller sized mobile phone in a watch casing or a similar small footprint. However, these attempts have been generally unsuccessful due to limitations on antenna sizes allowed by such packages. For good radio frequency reception, the length of the antenna plus the antenna ground plane should be at least one half wavelength of the RF signals being transmitted.

Generally, an antenna ground plane may require anywhere from 40 mm to 80 mm in length due to the frequency of operation. For example, for Global Positioning System (GPS) receiver antennas a quarter wavelength for the antenna ground plane is 47 mm. For personal communication systems (PCS) antennas, a quarter wavelength for the antenna ground plane can be 40 mm in length. For cellular bands, a quarter wavelength for the antenna ground plane can be 87 mm in length. Due to the small footprint of a watch casing, the wrist of the user, and the operating frequency of the antenna, a relatively larger size antenna ground plane would be required for a "watch phone" that generally is larger than the watch casing. Previous efforts to manufacture a watch phone with a smaller sized antenna ground plane have been unsuccessful.

SUMMARY

The various embodiments include a method and apparatus for manufacturing a printed circuit board or PCB assembly that provides an integrated ground plane extension suitable for small footprint devices. The method includes laying layers in a stacked arrangement to form the PCB assembly having at least one RF ground layer. The method also includes extending at least one layer beyond the layers to form an antenna ground plane extension and forming the at least one conductive layer as a unitary member (i.e., without the need for an electrical connection to the PCB assembly). The at least one conductive layer may include a first portion located in the PCB stack and a second portion extending outside of the PCB stack. The first portion is unitary with the second portion. The extended conductive layer can be used to form a continuous ground plane element along a width of the PCB assembly.

In embodiments, the second portion may be a flexible member that may be operatively connected to an antenna to the PCB assembly. The layers form a PCB stack. The at least one flexible member may extend outward from a middle of the stack, or between a top and a bottom of the stack. The least one flexible member also may extend outward from a top of the stack. The at least one flexible member may further extend outward from a bottom of the stack. The at least one conductive layer may extend beyond the plurality of layers to form the antenna ground plane extension and can be generally rectangular in shape. The at least one conductive layer portion which extends beyond the PCB stack may alternatively include an L shaped member or an S shaped member.

In another embodiment, a printed circuit board includes a plurality of layers stacked to form a PCB assembly with at least one layer comprising an RF ground layer that extends beyond the plurality of stacked layers to form an antenna ground plane extension.

In another embodiment, a mobile phone includes a processor connected to a memory and to a wireless communication transceiver formed as a plurality of layers in a stacked arrangement to form a PCB assembly having at least one layer extending beyond the PCB assembly to form an antenna ground plane extension. The at least one conductive layer may include a first portion located in a stack and a second portion extending outside of the stack. In a further embodiment, the mobile phone may be configured as a watch phone. The extended conductive layer which forms a continuous ground plane element is a portion of a band of the watch. In another embodiment, the extended conductive layer may also reside inside the case of a watch. In such an embodiment, the PCB stack may be located near the rear of the liquid crystal display (LCD) and the ground extension element may be both inside and outside of the case of the watch.

BRIEF DESCRIPTION OF THE DRAWINGS

The accompanying drawings are presented to aid in the description of embodiments of the disclosure and are provided solely for illustration of the embodiments and not limitation thereof.

DETAILED DESCRIPTION

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the disclosure or the claims. Alternate embodiments may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any embodiment described herein as "exemplary" and/or "example" is not necessarily to be construed as preferred or advantageous over other embodiments.

As used herein, the terms "computing device" and "mobile computing device" refer to any one or all of cellular telephones, smart phones, personal data assistants (PDA's), palm-top computers, tablet computers, notebook computers, personal computers, wireless electronic mail receivers, multimedia Internet enabled cellular telephones, and similar electronic devices which include multiple programmable processors, and memory.

Figure 1:
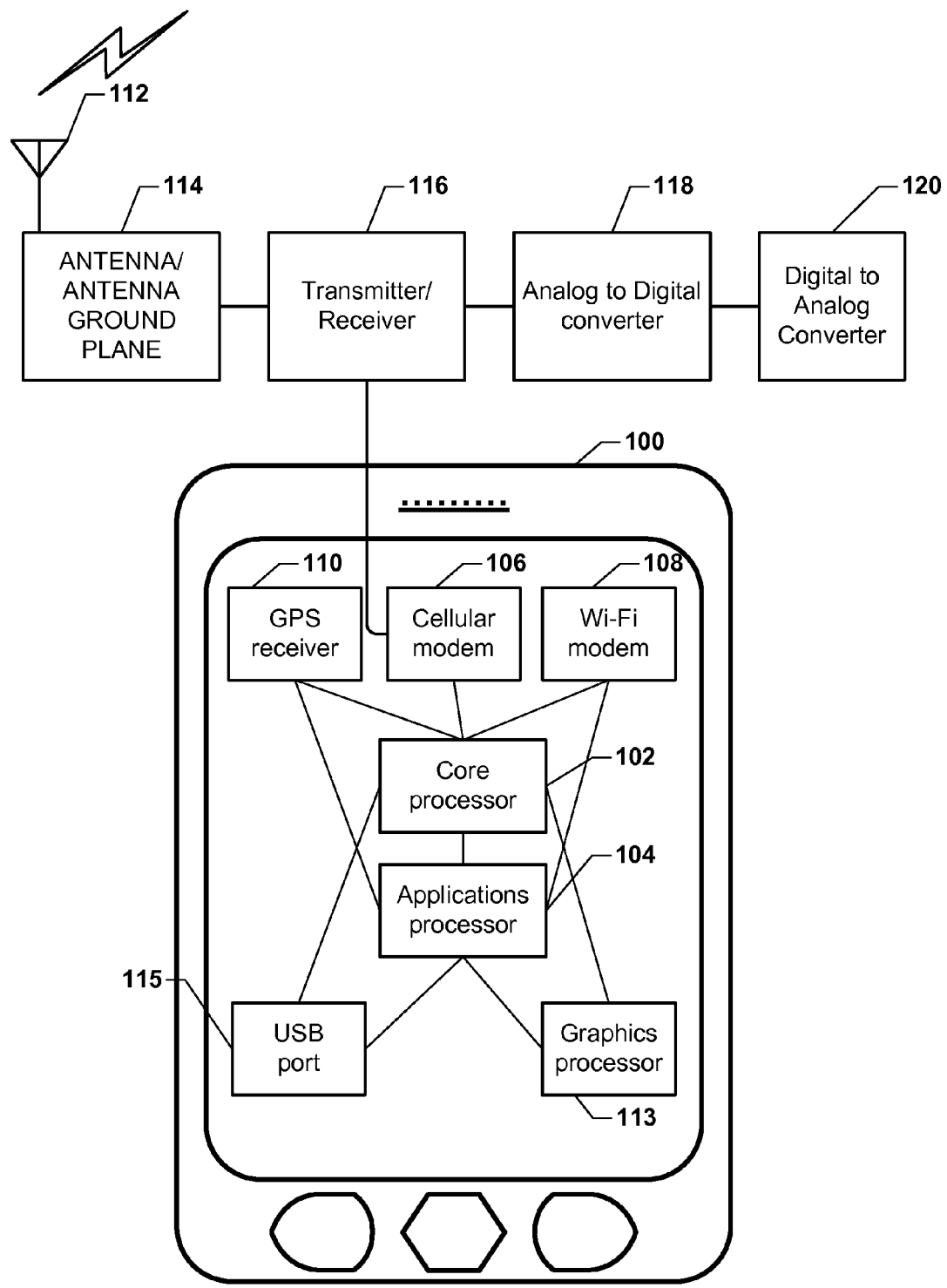
FIG. 1 is a functional block diagram of a mobile computing device suitable for use with the various embodiments.

A typically mobile computing device is illustrated in FIG. 1. This figure provides a block diagram of an exemplary smart phone 100 illustrating the types of processors that are included in a typical smart phone (e.g., Android® or iPhone Phone®) and a wireless communication device that includes an antenna 112 and an antenna ground plane 114 in a block diagram. In particular, modern smart phones 100 will often include a core processor 102 which may include a coprocessor for executing applications, sometimes referred to as an application processor 104. The core processor 102 and applications processor 104 may be configured in the same microchip package or in separate chips. While the core and applications processors may be the heart of the smart phone 100, there are typically a number of peer processors associated with important device capabilities including communications, navigation and graphics. For example, a smart phone 100 will typically include a cellular transceiver or modem 106 which in many cases includes one or more processors whose main task is managing wireless communications. Many smart phones 100 also include other wireless transceivers for communicating over other types of wireless communications networks, such as a Wi-Fi modem 108 for connecting the device to Wi-Fi communication networks. In some cases, the Wi-Fi modem 108 may be a separate transceiver chip, in which case it may also include a separate programmable processor. Other wireless transceivers (not shown) which have embedded programmable processors may be included to connect to other types of wireless communication links, such as near field communications (NFC) links, Bluetooth® links, and links based on other wireless protocols.

In addition to the communications processors, modern smart phones also typically include a GPS receiver 110 which may have a dedicated processor. Also, a graphics processor 113 may be included in order to provide high-resolution graphics. Some smart phones 100 may also include processors associated with wired communications, such as a USB port 115.

While FIG. 1 shows a smart phone 100, and frequent reference to mobile computing devices may be made in the following descriptions of the various embodiments, the claims are not limited to smart phones or mobile computing devices unless specifically recited. The various embodiments may be implemented in any small foot print device, such as a watch phone, a small footprint computing device or any other computing device known in the art that includes a small housing. For example, the present disclosure may be directed to a personal locator device, a microphone, a lapel microphone, a button, a brooch phone, a bracelet phone, a pet locator, dog tags, labels, or any other device that emits a radiofrequency signal. In one embodiment, a small housing may mean a housing that is less than one eighth of the wavelength of the lowest operation frequency.

FIG. 1 illustrates a mobile device 100 that includes an antenna configuration as an antenna 112 and an antenna ground plane 114, a transmitter and receiver 116, and an analog to digital converter and a digital to analog converter 118 and 120.

Figures 2A, 2B:
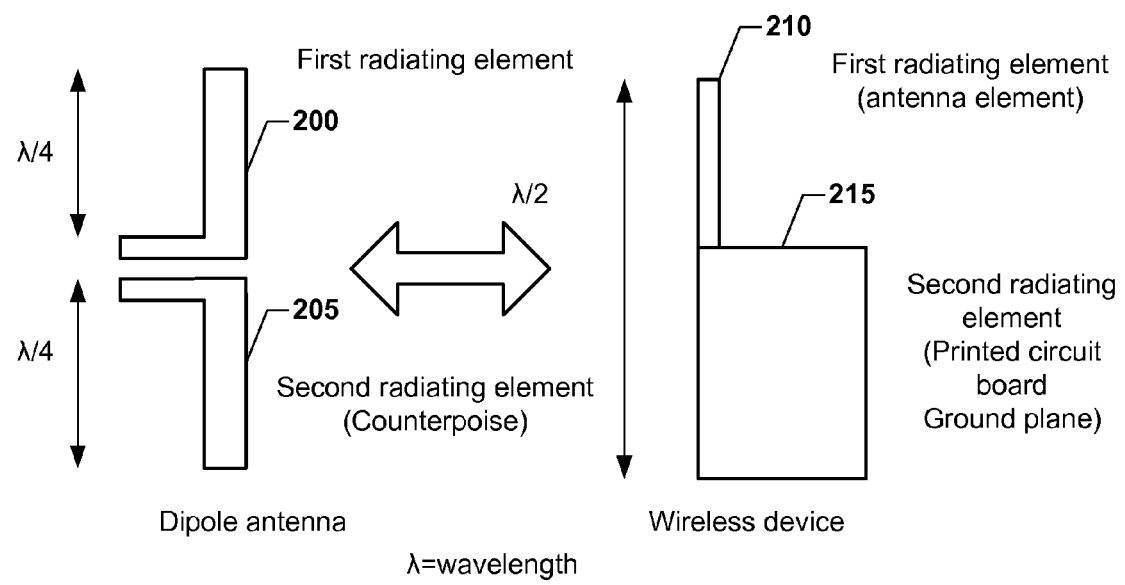
FIG. 2A is a conventional configuration of a dipole antenna including a radiating element and a counterpoise element.
FIG. 2B is another conventional configuration of a wireless device including a first radiating element and a second radiating element or a PCB board which is a ground plane.

FIG. 2A illustrates an antenna 200 and a counterpoise element 205 according to a conventional dipole configuration. The antenna 200 and the counterpoise element 205 generally have the same length. The antenna of radio device is one of the most important components and includes both the antenna 200 and a ground plane, or counterpoise element 205, the size of which depends upon the frequency of the radio signals. Essentially, the antenna requires a total antenna 200 length and the length of the ground plane 205 to be cumulatively about a half wavelength of an operating frequency as shown. The antenna element 200 includes a quarter wavelength of the operating frequency and the counterpoise element 205 also includes a quarter wavelength of the operating frequency. In some embodiments depending on the operating frequency the counterpoise length may be 40 mm, 47 mm, 80 mm, or 87 mm. The total length with the first radiating element 200 is one half wavelength.

FIG. 2B illustrates a conventional configuration of an antenna 210 and a printed circuit board ground plane element 215 for a wireless device. In this example, the total length is one half wavelength (cumulatively of the antenna 210 and the ground plane 215). Generally, in today's mobile phones many antennas 210 are internally located and meander within a housing and are sufficiently long for operation. Generally, to fit the form of a small housing, (e.g., a wrist watch, a lapel microphone, a wireless microphone, a brooch phone, a button, dog tags, a pet locator device, a personal locator device, or a smart card) wireless devices have to be quite small. This small footprint generally does not support conventional mechanisms for configuring the antenna ground plane 215 at the frequencies of cellular communications.

In conventional cell phones, the printed circuit board (PCB) 215 of the phone functions as the ground plane 215 for the antenna element 210, which is similar to the concept of a dipole element shown in FIG. 2A. Generally, the printed circuit board 215 of FIG. 2B is analogous to the second radiating element or counterpoise element 205 in FIG. 2A.

The problem faced in a small device is that the footprint attributed to the housing may be too small to accommodate a proper length of the antenna ground plane using the radio printed circuit board 215. If the footprint was enlarged, then the user may not desire to use the article. For example, if the watch included a large printed circuit board and was too large to fit on a wrist, (or visually distinct than a consumer expectation) this may be disfavored or uncomfortable for a user. For example, if one kept extending the length of the antenna 210 of FIG. 2A with a shorter and insignificant antenna ground plane 215, this would not result in a well functioning antenna 210. When a printed circuit board 215 is small, the total length can be one half wavelength attributed to the antenna 210, but the antenna ground plane 215 may be less than a quarter wavelength and thus insufficient for RF operation.

Modern compact electronics are assembled as layers of printed circuit boards (PCB) that form a PCB assembly. Layering PCB's allows the footprint of a device to be reduced. PCBs are quite thin, so PCB assemblies do not add significantly to the height of devices. As an example, a cellular telephone circuit assembly may be formed as an 8-layer PCB assembly an example of which is shown in FIG. 3A as PCB stack 350.

Figure 3A:
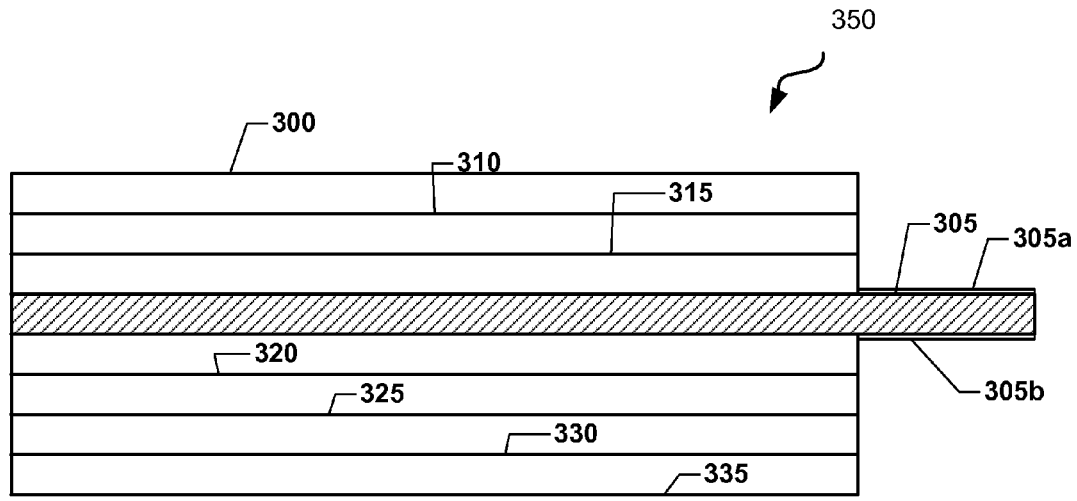
FIG. 3A is an illustration of a PCB including a ground plane element that extends beyond the PCB stack according to an embodiment.

FIG. 3A illustrates a printed circuit board 350 according to the present disclosure that includes at least one RF ground layer element and at least one conductive layer 305. The RF antenna ground plane is larger than a length the PCB assembly 350 of the wireless device so the RF antenna ground plane extends beyond the PCB assembly 350. The portion of the PCB ground plane extending beyond the periphery of the PCB stack is referred to herein as the antenna ground plane extension. In one embodiment, the PCB assembly 350 may include multiple layers of conductors and several RF ground layers. In another embodiment, the RF ground layer and the conductive layer 305 may be the only ground layer. In another embodiment, the conductive layer 305 may be one of many layers.

In an embodiment, the conductive layer 305 may extend outwardly from the PCB stack 350 to provide a antenna ground plane extension that lengthens the ground plane in a unitary manner without any connection between parts within the PCB stack and the antenna ground plane extension outside of the PCB stack. More particularly, the conductive layer 305 is stretched, layered, or otherwise extends out of the stack 350 in a unitary manner, or the conductive layer 305 has an indivisible character of a single unit. This provides an antenna ground plane that encompasses in a unitary manner the ground plane within the PCB stack and the ground plane extension. In one embodiment, the at least one conductive layer 305 forming the ground plane extension may extend from the PCB stack 350 from one direction of the PCB stack 350. In another embodiment, the at least one conductive layer 305 forming the ground plane extension may extend from the PCB stack 350 from two directions of the PCB stack 350. In yet another embodiment, the at least one conductive layer 305 forming the ground plane extension may extend from the PCB stack 350 from more than two directions of the PCB stack 350, for example from three directions or more than three directions.

In one embodiment, the at least one conductive layer 305 forming the ground plane extension may extend from a middle layer of the PCB stack 350. However, in another embodiment, the at least one conductive layer 305 forming the ground plane extension may extend from a top side or a bottom side of the PCB stack 350. In an embodiment, the conductive layer 305 forming the ground plane extension may comprise a single layer of material. In an alternative embodiment, the at least one conductive layer 305 forming the ground plane extension may comprise multiple layers of conductive material. In a further embodiment, the at least one layer of conductive material 305 forming the ground plane extension is a unitary member formed in the PCB stack 350 that extends out of the stack 350. For example, a first portion may be within the stack 350 while an integrally connected second portion (i.e., the extension) may be located outside of the stack 350. Preferably, the first and the second portions are flexible. However, in another embodiment, only the second portion that is located outside of the stack 350 may be flexible. Further, the first portion may comprise a multilayered material while the second portion may be single- or multilayered.

Advantageously, there is no mechanical connection assembly between a portion of the conductive layer 305 that extends outside of a stack 350 forming the ground plane extension and the conductive layer 305 within the stack 350. The conductive layer 305 forming the ground plane extension may thus be formed as an integral and unitary member together with protection layers 305a and 305b.

By extending the length of a conductive layer 305 beyond the PCB stack 350 of the device electronics, a large enough ground plane can be provided for many RF applications. The PCB stack 350 provides the conductive layer 305 in conjunction with the flexible extension 305. This flexibility enables the rigid stack 350 to be fit and accommodated within device packaging while the flexible conductive layer 305 may extend outside the PCB stack 350 and outside of the device packaging. In another embodiment, which is described in more detail below with reference to FIG. 9, the flexible conductive layer 305 may be disposed in a case of a device that has an angular shape as the rigid PCB could not be made in an angular shape. For example, a casing may include a top and a bottom surface that angles downwardly. The PCB element may rest in the casing, the flexible conductive layer 305 extending between the top and bottom surfaces that angle downwardly, and thus fit into a constraining space.

Thus, the flexible conductive layer 305 forming the ground plane extension may extends outside of the stiff stack 350 and may hang out of a relatively small footprint housing, for example, a personal locator device or a watch phone, or any other housing that is less than one eighth of a wavelength of the lowest operating frequency. Reference to specific applications for the antenna ground plane extension and printed circuit board 350 form no limitations to the present disclosure.

To provide a larger ground plane and avoid the problems of connecting a ground plane extension to a conductive layer 305 of the PCB assembly 350, the unitary conductive layer 305 may be stretched to extend from within the PCB assembly 350 to beyond the area of the PCB stack 350, or alternatively, may be manufactured as longer than the other layers in the PCB stack. For example, the at least one conductive layer 305 may be manufactured as longer than the layers 310, 315, 320, 325, 330 and 335 and laid in or over with the layers 320, 325, 330 and 335.

The conductive layer 305, including the ground plane extension, may be made from a copper or a conductive element. By extending the conductive element from the PCB stack 350 a larger ground plane is manufactured without having to connect any disfavored extension to the rest of the PCB assembly 350 via a connector, or mechanical fastener.

Also, the conductive connection between the at least one conductive layer 305 forming the ground plane extension and the PCB assembly 350 may be continuous along the width of the PCB stack 350, which improves its antenna performance. With no connector element required between the PCB stack 350 and the extended ground plane element 305, the PCB stack 350 and the extended ground plane element 305 form an integrated unitary member.

In an embodiment, the extended ground plane element 305 may be laminated between protective/insulator layers 305a and 305b to protect the extended ground plane element 305, or can be laminated only on at least one of a top and a bottom surface. In one embodiment, the conductive layer 305 may be manufactured very thin. For example, normally the total thickness of eight layers of the PCB stack 350 can be about one mm. In such an embodiment, the first and the second protective material 305a and 305b may protect the thin conductive layer 305. The first and the second protective material 305a and 305b may be manufactured as a thermoplastic, or other protective material known in the art to provide protection to the at least one conductive layer 305.

Conducting layers of the stack 350 may be manufactured from a conductive material, such as, for example, a thin copper foil. Insulating layers of the stack 350 are made from a dielectric and are typically laminated together with epoxy resin prepreg. The PCB stack 350 is typically coated with a solder mask. Several different dielectrics that can be chosen to provide different insulating values depending on the requirements of the circuit. Some of these dielectrics are polytetrafluoroethylene (Teflon), FR-4, FR-1, CEM-1 or CEM-3. Prepreg materials used in the PCB industry are FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester). Thermal expansion is an important consideration for dimensional stability. In this embodiment, an FR-4 material (Woven glass and epoxy) is a preferred material. In one embodiment, the conductor 305 may include a copper foil thickness that can be specified in ounces per square foot or micrometers. One ounce per square foot is 1.344 mils or 34 micrometers.

Figure 3B:
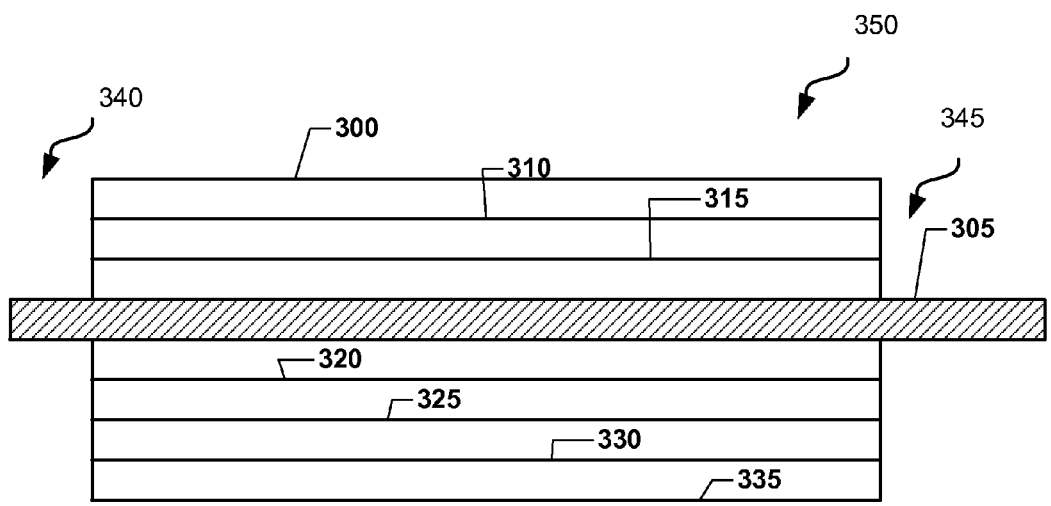
FIG. 3B is an illustration of a PCB including a ground plane element that extends beyond at least two different sides of the PCB stack according to a second embodiment.

FIG. 3B illustrates an alternative embodiment in which the at least one conductive element 305 forming the ground plane extension extends from at least two sides 340 and 345 of the PCB stack 350 in a unitary manner. In another embodiment, the conductive element 305 may extend from three or four sides in a unitary manner.

Figure 3C:
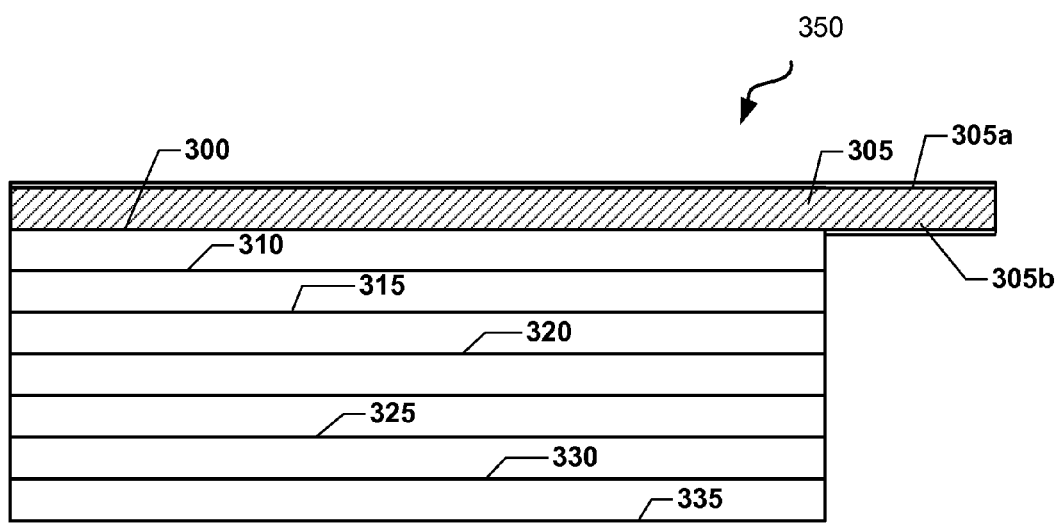
FIG. 3C is an illustration of a PCB including a ground plane element that is a top member of the PCB stack and which extends beyond the PCB stack.

FIG. 3C illustrates another alternative embodiment in which the at least one conductive layer 305 forming the ground plane extension includes a protection layer 305a and a second protection layer 305b. However, in this embodiment, the at least one conductive layer 305 is flexible and is manufactured as a top layer 305 of the PCB stack 350. In this embodiment, the protective layer 305a may extend only over the portion of the conductive layer 305 that extends outside of the stack 350 or may extend along an entire length of the conductive layer 305.

Figure 3D:
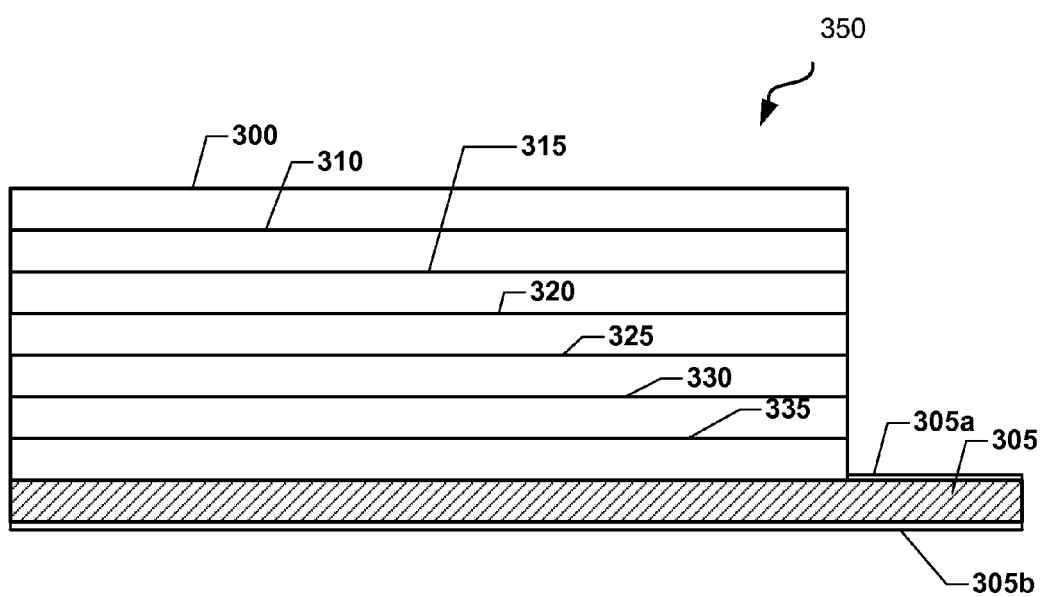
FIG. 3D is an illustration of a PCB including a ground plane element that is a bottom member of the PCB stack and which extends beyond the PCB stack.

FIG. 3D illustrates another alternative embodiment in which the conductive layer 305 forming the ground plane and ground plane extension is manufactured as a bottom layer 305 of the PCB stack 350. Similar to the embodiment of FIG. 3C, the at least one conductive element 305 includes the first protection layer 305a and the second protection layer 305b. In this embodiment, the protective layer 305b may extend only over the portion of the conductive layer 305 that extends outside of the stack 350 or alternatively may extend along an entire length portion of the conductive layer 305 as shown.

Figure 4:
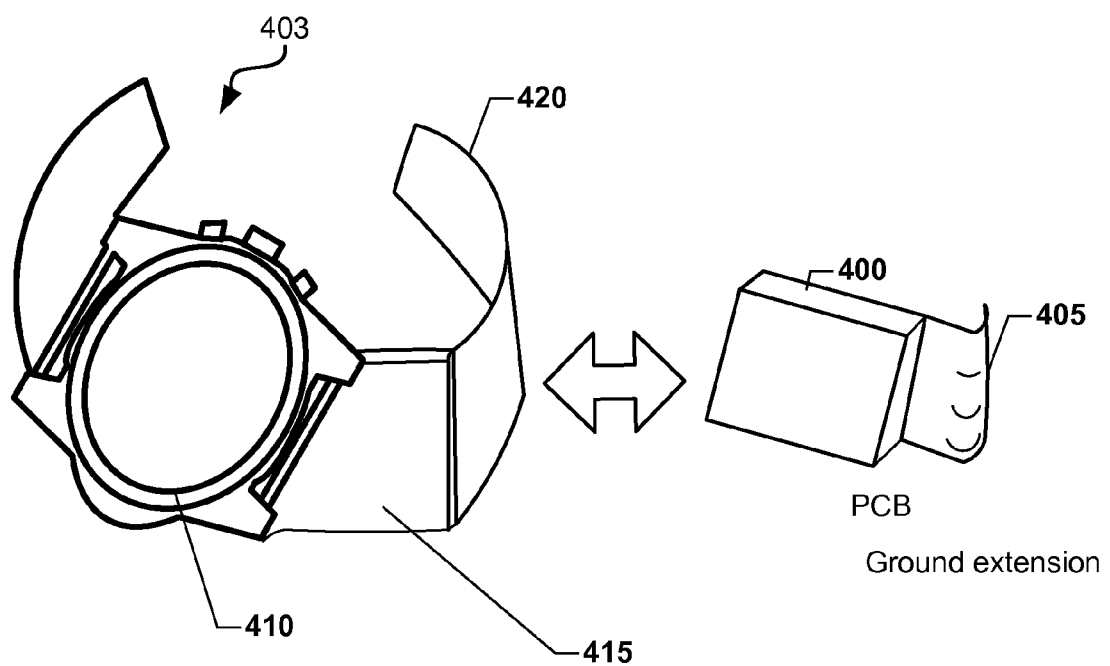
FIG. 4 is a perspective partially exploded view of the antenna ground plane element extending outside of the PCB stack and where the ground extension is inside the watch casing and extending both inside and outside of the watch casing.

FIG. 4 illustrates a watch phone 403 and the PCB assembly 400 contained within the watch phone 403 shown in a partially exploded perspective view. The watch phone 403 includes a housing 410 and a battery 415 and a band shaped member 420 for encircling a user's wrist. Adjacent to the watch phone 403 is the PCB stack 400, which is contained within the housing 410. The watch phone 403 also includes a processor 102, a memory, a bus and several components suitable for the wireless communication device similar to those shown in FIG. 1. The PCB stack 400 includes a unitary ground plane element 405 extending from a PCB stack 400. As shown in FIG. 4, the unitary ground plane extension element 405 is flexible and can bend. This flexible unitary ground plane element 405 may also be curved or bent to fit within the watch phone housing 410 as shown, or can extend outside of the watch phone 403 and form a portion of the band 420. For example, this configuration would enable the ground plane to be located adjacent a lithium ion or nickel cadmium battery 415.

Figure 5A:
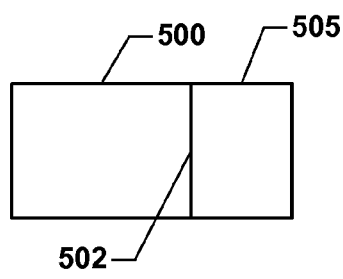
FIG. 5A-5C are top views of the antenna ground plane element extending outside of the PCB stack and including different shapes (rectangular shaped, L-shaped, and S-shaped, respectively).
Figure 5B:
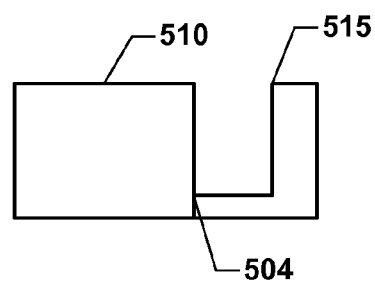
Figure 5C:
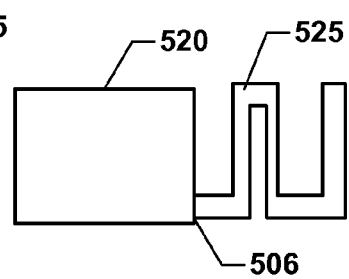

FIGS. 5A-5C illustrate several embodiments of the unitary ground plane element 505, 515 and 525 being illustrated in a top view. The unitary ground plane element 505, 515 and 525 are each connected to a respective PCB stack 500, 510 and 520. In a first embodiment shown as FIG. 5A, the unitary ground plane element 505 may be manufactured according to a rectangular shape and can be connected along an entire length 502 of the PCB stack 500. It should be appreciated that in another embodiment, the unitary ground plane element 505 may only be connected along a portion of the length 502. However, in a further embodiment, the extended ground plane element 505, 515 and 525 may be formed into different shapes in order to extend the effective length of the ground plane, as may be required for different device sizes, operating frequency parameters and packaging footprints.

For example, as shown in FIG. 5A, the extended ground plane element 505 may include a configuration in which the extended ground plane element 505 is connected continuously along the lateral side 502 of a PCB stack 500. In another embodiment, the extended ground plane element 515 is L-shaped in FIG. 5B; or is S-shaped 525 in FIG. 5C. In the embodiments of FIGS. 5B and 5C, the extended ground plane element 515 and 525 may be connected to only a portion 504 or 506 of the length of the PCB stack 510 and 520. The portion of the extended ground plane elements 515 and 525 outside of the stack are integral with a portion located within the PCB stack 510 and 520. In yet another embodiment, the extended ground plane element 505 may include a U shape, a V shape, a polygonal shape, a T shape, a B shape, an irregular shape or any other shape known in the art.

Figure 6:
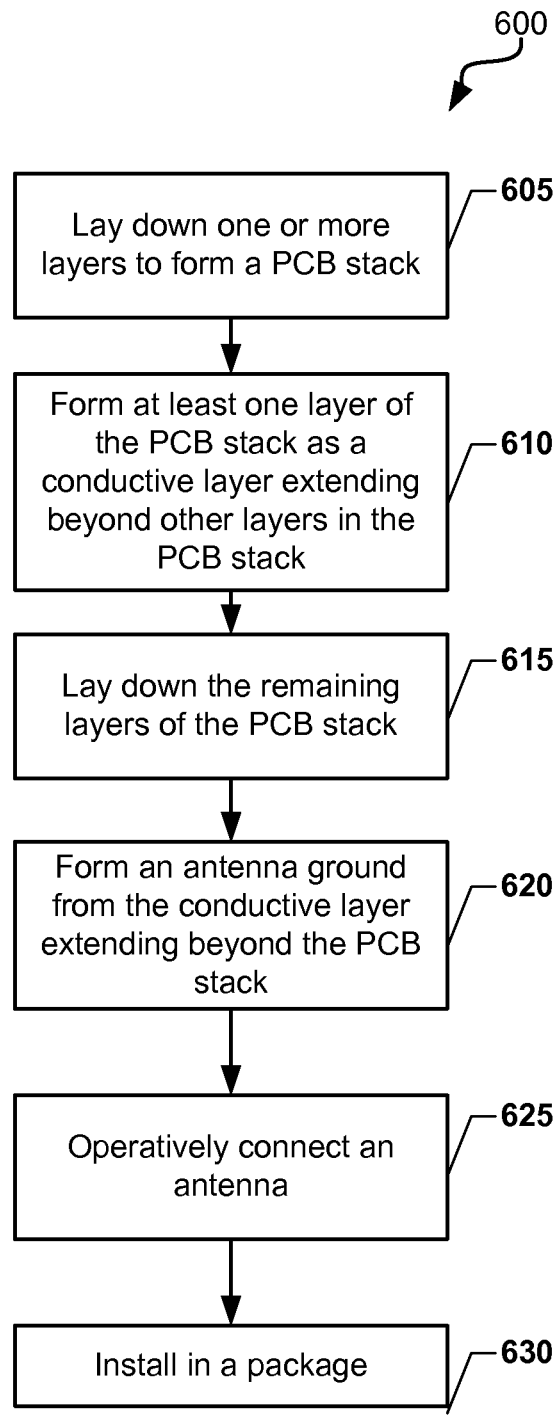
FIG. 6 is a process flow diagram of an embodiment method for forming a PCB stack having at least one antenna ground plane element extending beyond the PCB stack.

FIG. 6 illustrates an embodiment method of manufacturing the printed circuit board assembly with a ground plane extension. The manufacture of the PCB according to the method 600 may commence by laying out one or more layers to form a PCB stack in block 605. For example, a number of layers may be laid down, for example, eight layers or more. In block 610, at least one layer of the PCB stack is formed as a conductive layer. The at least one layer is made larger in length and or width, and extends well beyond the other layers of the PCB stack. In block 615, the remaining layers of the PCB stack are laid down. In another alternative embodiment, the conductive layer can be formed using chemical vapor deposition, or physical vapor deposition. In another embodiment, the conductive layer may be formed using known printed circuit board manufacturing techniques.

In block 620, the conductive layer is formed as an antenna ground plane that extends beyond the PCB stack. In an embodiment, the insulating layer is connected to the conductive layer. The insulating layer may extend outside of the PCB stack. In block 625, an antenna is operatively connected. It should be appreciated that there are many ways to integrate an antenna with the extended ground plane of the various embodiment, and may vary depending on the shape and type of antenna. For example, the antenna may be connected via a pogo pin or another connector. In another embodiment, an antenna may be located on the watch strap on an opposite side of the antenna ground extension, and may connect to the PCB stack via a connector element. In block 630 the PCB stack and the antenna are installed into a package. For example, the package can be a small footprint housing, a watch, or a wireless communication device.

In another embodiment, the flexibility of the conductive layer that extends outside of the PCB stack may be controlled by an insulting layer that is connected to the conductive layer. For example, a thick insulating layer may be manufactured. The thickness of the insulating layer may thus make the conductive layer less flexible. For example, in an alternative embodiment, a thin insulating layer may be manufactured and connected to the flexible conductive layer. The thin insulating layer may maintain a flexibility of the conductive layer.

In another embodiment, the extended conductive layer may be manufactured by etching away a portion of the PCB stack to reveal and expose the conductive layer located in the PCB stack. For example, the manufacture of the PCB may begin by laying out one or more layers to form a PCB stack and each layer being made relatively larger in size with the desire to subtract a portion of the layers. Thereafter, layers on the top and the bottom will be etched away so at least one layer extends well beyond the other layers of the PCB stack. The remaining exposed conductive layer can be formed as an antenna ground plane that extends beyond the PCB stack. An insulating layer can be connected to the conductive layer. An antenna can be operatively connected to the PCB stack and the PCB and the antenna are installed into a package.

In another embodiment, the antenna ground plane extension is manufactured using a chip manufacturing method, for example by a sputtering deposition or chemical vapor deposition. In one embodiment, the amount that the portion extends outside of the stack is 35 mm.

Figure 7:
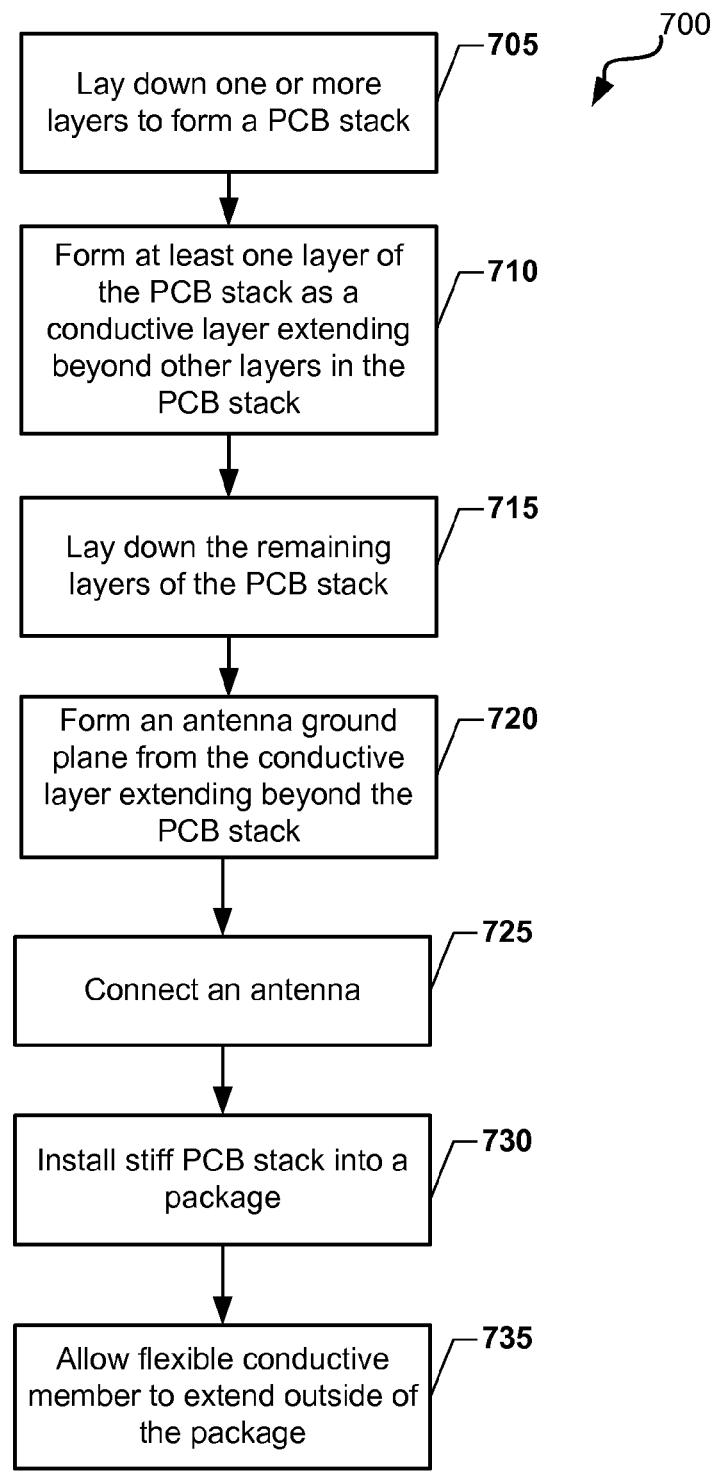
FIG. 7 is a process flow diagram of an embodiment method for forming a watch phone comprising a PCB stack having at least one antenna ground plane element extending beyond the PCB stack.

FIG. 7 illustrates an embodiment method 700 of manufacturing the printed circuit board assembly according to an alternative embodiment. In method 700, a PCB stack is formed in block 705 by laying a plurality of layers of material to form the PCB stack. In block 710, the method 700 forms at least one layer of the PCB stack as a conductive layer extending beyond the other layers of the PCB stack. The at least one conductive layer may be formed as a flexible layer in the PCB stack. The conductive layer may be copper or a similar conductor. In block 715, the remaining layers of the PCB stack can be laid down. A first conductive portion is located within the PCB stack and a second unitary conductive portion is located outside of the stack to form a unitary member. For example, the unitary member may be formed longer than the other layers or can be stretched to be located outside of the PCB stack. A portion of the conductive layer is located in the PCB stack and a second unitary portion of the conductive layer is located outside of the PCB stack. Advantageously, there is no mechanical connection between the portion located in the stack and located outside of the stack. The conductive layer may be laminated. For example, the top and the bottom of the conductive layer can be applied with a laminate.

In block 720, an antenna ground plane is formed from the conductive layer extending beyond the PCB stack. In block 725, an antenna is operatively connected to the PCB stack. In block 730, the relatively stiff PCB stack is installed into a package and in block 735 the flexible conductive member extends outside of the package. An operating frequency of a wireless communication device may be determined and a size of a package/footprint for the wireless communication device may also be determined. Signals can be transmitted from the antenna or received from the antenna.

Figure 8:
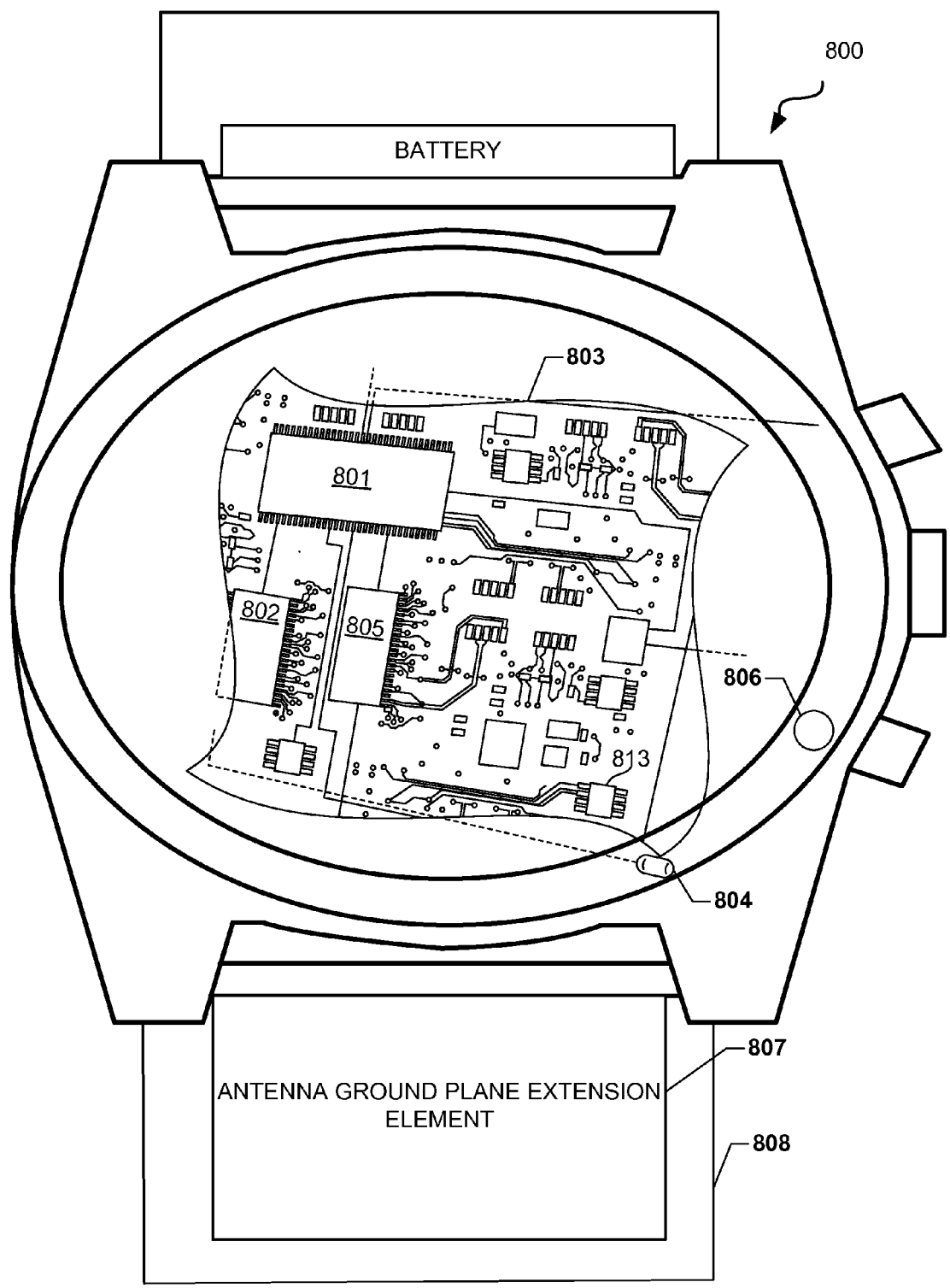
FIG. 8 is a top view of a watch phone having a front face removed illustrating components of the wireless communication device and an antenna ground plane element extending beyond a PCB stack.

FIG. 8 is a system block diagram of a watch phone 800 suitable for use with any of the embodiments. The embodiments may be implemented in a variety of mobile computing devices, particularly mobile computing devices. An example of a mobile computing device that may implement the various embodiments is a watch phone 800 illustrated in FIG. 8 but is not limited to a watch phone and many other devices may utilizing the antenna ground plane element. A multi-processor mobile computing device, such as a smart phone 800, may include a processor 801 coupled to memory 802 and to a radio frequency data modem 805. The modem 805 may be coupled to an antenna 804 for receiving and transmitting radio frequency signals. The smart phone 800 may also include a display 803, such as a touch screen display. The mobile computing device 800 may also include user input devices, such as buttons 806, to receive user inputs.

The mobile computing device processor 801 may be any programmable microprocessor, microcomputer or multiple processor chip or chips that can be configured by software instructions (applications) to perform a variety of functions, including the functions of the various embodiments described herein. Typically, software applications may be stored in the internal memory 802 before they are accessed and loaded into the processor 801. In some mobile computing devices, additional memory chips (e.g., a Secure Data (SD) card) may be plugged into the mobile computing device and coupled to the processor 801. The internal memory 802 may be a volatile or nonvolatile memory, such as flash memory, or a mixture of both. For the purposes of this description, a general reference to memory refers to all memory accessible by the processor 801, including internal memory 802, removable memory plugged into the mobile computing device, and memory within the processor 801.

The processor 801 may be any programmable microprocessor, microcomputer or multiple processor chip or chips that can be configured by software instructions (applications) to perform a variety of functions, including the functions of the various embodiments described above. In some devices, multiple processors 801 may be provided, such as one processor dedicated to wireless communication functions and one processor dedicated to running other applications. Typically, software applications may be stored in the internal memory 802 before they are accessed and loaded into the processor 801.

The processor 801 may include internal memory sufficient to store the application software instructions. In many devices the internal memory may be a volatile or nonvolatile memory, such as flash memory, or a mixture of both. For the purposes of this description, a general reference to memory refers to memory accessible by the processor 801 including internal memory or removable memory plugged into the device and memory within the processor 801 itself. The mobile phone is configured as a watch having a band 808, and an extended conductive layer which forms a continuous ground plane element 807 is shown as illustrated as a portion of the band 808 of the watch phone 800.

The watch phone 800 may also include a number of connector ports coupled to the processor 801 for establishing data connections or receiving external memory devices, such as a USB or FireWire® connector sockets, or other network connection circuits for coupling the processor 801 to a network.

Figure 9:
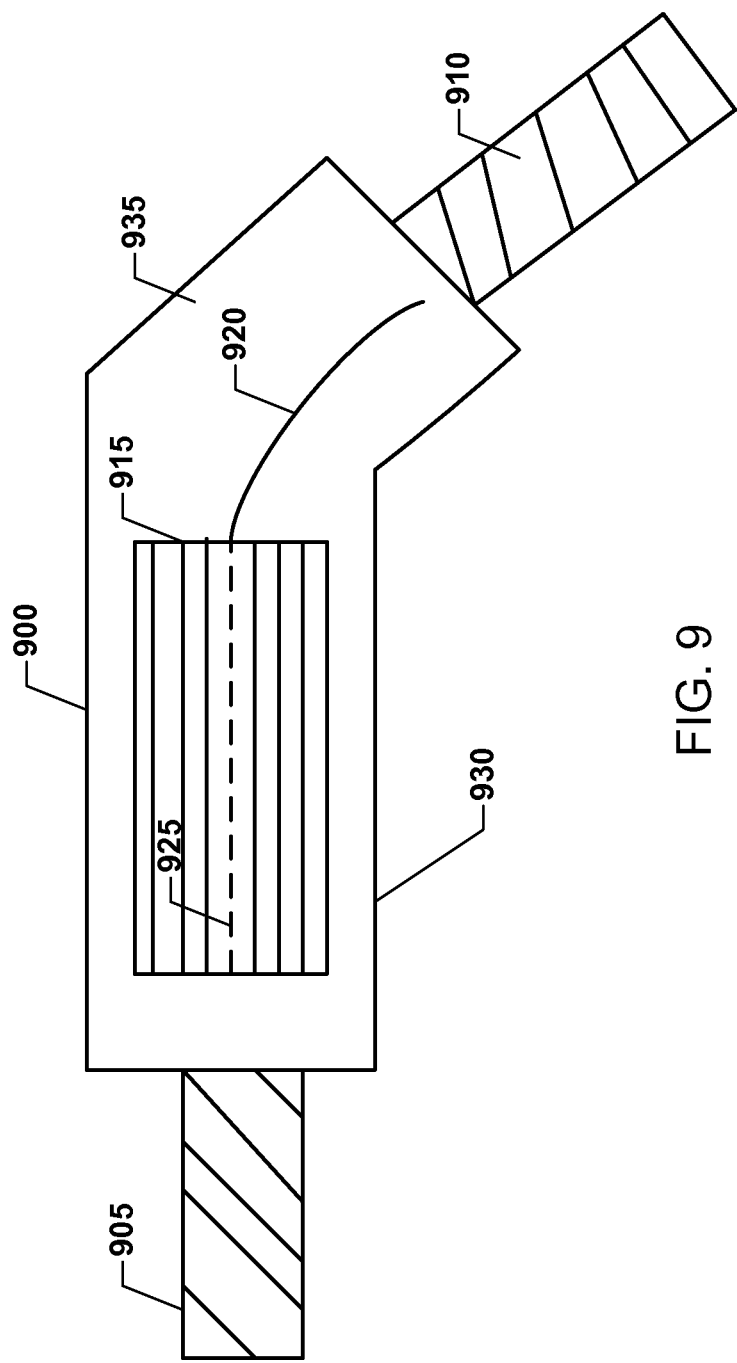
FIG. 9 is a side view of a watch phone embodiment including an angular shaped housing with a flexible antenna ground plane element extending beyond a PCB stack and into the angular shaped housing.

FIG. 9 illustrates a simplified diagram of an embodiment in which a watch phone casing 900 includes a planar portion 930 and an angular portion 935. The watch casing 900 is connected to a first band portion 905 and a second band portion 910. The angular portion 935 connects to the band portion 910. The planar portion 930 connects to band portion 905. A PCB stack 915 is located within the planar portion 930 of the watch phone casing 900. As shown, the PCB stack 915 cannot extend into the angular portion 935 due to space constraints. However, a continuous ground plane element that comprises a portion 925 in the PCB stack 915 and a unitary flexible extension portion 920 outside of the PCB stack 915 may be dimension to fit within the casing 900. Specifically, the unitary flexible extension portion 920 may extend into and within the angular portion 935.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary embodiments, the functions described may be implemented in hardware, software, firmware, or any combination thereof. If implemented in software, the functions may be stored as one or more instructions or code on a non-transitory computer-readable or processor-readable storage medium. The steps of a method or algorithm disclosed herein may be embodied in a processor-executable software module executed which may reside on a non-transitory computer-readable medium. Non-transitory computer-readable and processor media include any available storage media that may be accessed by a computer or processor. By way of example, and not limitation, such non-transitory computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of non-transitory computer-readable media. Additionally, the operations of a method or algorithm may reside as one or any combination or set of codes and/or instructions on a non-transitory machine readable medium and/or non-transitory computer-readable medium, which may be incorporated into a computer program product.

The preceding description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the following claims and the principles and novel features disclosed herein.

What is claimed is:

1. A printed circuit board (PCB) of a watch phone, comprising:
a plurality of layers being stacked to form a PCB assembly with at least one layer comprising a radio frequency (RF) ground layer that is configured to extend in a unitary manner beyond the plurality of stacked layers to form an antenna ground plane comprising a portion within the PCB assembly configured to be positioned in the watch phone and a portion extending beyond the PCB assembly configured to be positioned within a portion of a band of the watch phone.

2. The printed circuit board of claim 1, wherein:
the portion of the RF ground layer extending beyond the PCB assembly is a flexible member.

3. The printed circuit board of claim 1, further comprising:
an antenna connected to the PCB assembly.

4. The printed circuit board of claim 1, wherein:
the portion of the RF ground layer extending beyond the PCB assembly includes a length that is greater than the other of the plurality of layers to increase an antenna ground plane length beyond a PCB assembly length.

5. The printed circuit board of claim 1, wherein:
the plurality of layers form a stack that comprises a rigid member, wherein the rigid stack is adapted to fit into a device packaging of the watch phone, and wherein the portion extending beyond the PCB assembly is flexible.

6. The printed circuit board of claim 1, wherein:
the plurality of layers form a stack, and wherein the RF ground layer extends outward from a middle of the stack between a top layer and a bottom layer of the stack.

7. The printed circuit board of claim 1, wherein:
the plurality of layers form a stack; and
the RF ground layer extends outward from a top layer of the stack.

8. The printed circuit board of claim 1, wherein:
the plurality of layers form a stack; and
the RF ground layer extends outward from a bottom of the stack.

9. The printed circuit board of claim 1, wherein:
the RF ground layer extends beyond the plurality of stacked layers to form the antenna ground plane that is generally rectangular in shape.

10. The printed circuit board of claim 1, wherein:
the portion extending beyond the plurality of stacked layers comprises an L shaped member.

11. The printed circuit board of claim 1, wherein:
the portion extending beyond the plurality of stacked layers comprises an S shaped member.

12. A watch phone, comprising:
a processor coupled to a memory;
an input device coupled to the processor;
a wireless communication transceiver coupled to the processor; and
a PCB assembly comprising a plurality of layers in a stacked arrangement having at least one radio frequency (RF) ground plane layer that is configured to extend in a unitary manner beyond the PCB assembly to form an antenna ground plane comprising a portion within the PCB assembly and a portion extending beyond the PCB assembly, wherein the RF ground plane layer forms a continuous antenna ground plane element spanning a first portion of the RF ground plane layer within the PCB assembly and a second portion that extends outside of the PCB assembly, and wherein the second portion of the RF ground plane layer is positioned within a portion of a band of the watch phone.

13. The watch phone of claim 12, wherein:
the first portion of the RF ground plane layer comprises a rigid member adapted to fit into a device packaging of the watch phone; and
the second portion that extends outside of the PCB assembly and is positioned within a portion of a band of the watch phone is flexible.

14. The watch phone of claim 12, wherein the second portion of the RF ground plane layer extends outward from a middle of the stacked arrangement between a top layer and a bottom layer thereof.

15. The watch phone of claim 12, wherein the second portion of the RF ground plane layer extends outward from a top layer of the stacked arrangement.

16. The watch phone of claim 12, wherein the second portion of the RF ground plane layer extends outward from a bottom layer of the stacked arrangement.

17. The watch phone of claim 12, wherein the second portion of the RF ground plane layer is generally rectangular in shape.

18. The watch phone of claim 12, wherein the second portion of the RF ground plane layer comprises an L shaped member.

19. The watch phone of claim 12, wherein the second portion of the RF ground plane layer comprises an S shaped member.

* * * * *